United States Patent
Numazawa et al.

(10) Patent No.: US 6,410,959 B2
(45) Date of Patent: Jun. 25, 2002

(54) METHOD OF FABRICATING SEMICONDUCTOR DEVICE

(75) Inventors: Sumito Numazawa; Yoshito Nakazawa; Masayoshi Kobayashi, all of Takasaki; Satoshi Kudo, Maebashi; Yasuo Imai, Takasaki; Sakae Kubo, Takasaki; Takashi Shigematsu, Takasaki; Akihiro Ohnishi, Isesaki; Kozo Uesawa, Tamamura-machi; Kentaro Oishi, Takasaki, all of (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/957,041

(22) Filed: Sep. 21, 2001

Related U.S. Application Data

(62) Division of application No. 09/621,620, filed on Jul. 21, 2000, now Pat. No. 6,307,231, which is a division of application No. 09/137,508, filed on Aug. 20, 1998, now Pat. No. 6,168,996.

(30) Foreign Application Priority Data

Aug. 28, 1997 (JP) .............................................. 9-232425

(51) Int. Cl.$^7$ ............................................ H01L 27/108
(52) U.S. Cl. ....................... 257/330; 257/341; 257/342; 438/270; 438/212; 438/268
(58) Field of Search ................................ 438/270, 212, 438/268, 327, 342; 257/330, 341, 342, 328

(56) References Cited

U.S. PATENT DOCUMENTS

| | | | |
|---|---|---|---|
| 5,072,266 A | * 12/1991 | Bulucea et al. ............ 357/23.4 |
| 5,283,201 A | * 2/1994 | Tsang et al. ................. 438/270 |
| 5,298,442 A | * 3/1994 | Bulucea et al. ............. 438/270 |
| 5,366,914 A | 11/1994 | Takahashi et al. .......... 438/270 |
| 5,479,037 A | 12/1995 | Hshich et al. ............... 257/328 |
| 5,558,313 A | 9/1996 | Hshich et al. ............... 257/342 |
| 5,578,508 A | 11/1996 | Baba et al. .................... 437/35 |
| 5,763,915 A | * 6/1998 | Hshich et al. ............... 257/330 |
| 5,783,491 A | 7/1998 | Nakamura ................... 438/702 |
| 5,907,776 A | 5/1999 | Hshieh et al. .............. 438/237 |
| 5,918,114 A | 6/1999 | Choi et al. |
| 5,940,721 A | 8/1999 | Kinzer et al. |
| 5,981,344 A | 11/1999 | Hshich et al. ............... 438/270 |
| 6,117,734 A | 9/2000 | Nakamura ................... 438/268 |

FOREIGN PATENT DOCUMENTS

| | | |
|---|---|---|
| EP | 666590 | 8/1995 |
| JP | 4-17371 | 1/1992 |
| JP | 7-245400 | 9/1995 |
| JP | 9-129877 | 5/1997 |

* cited by examiner

Primary Examiner—Matthew Smith
Assistant Examiner—B. V. Keshavan
(74) Attorney, Agent, or Firm—Mattingly, Stanger & Malur, P.C.

(57) ABSTRACT

In a method of fabricating a semiconductor device having a MISFET of trench gate structure, a trench is formed from a major surface of a semiconductor layer of first conductivity type which serves as a drain region, in a depth direction of the semiconductor layer, a gate insulating film including a thermal oxide film and a deposited film is formed over the internal surface of the trench, and after a gate electrode has been formed in the trench, impurities are introduced into the semiconductor substrate of first conductivity type to form a semiconductor region of second conductivity type which serves as a channel forming region, and impurities are introduced into the semiconductor region of second conductivity type to form the semiconductor region of first conductivity type which serves as a source region.

9 Claims, 14 Drawing Sheets

METHOD OF FABRICATING SEMICONDUCTOR DEVICE

This is a divisional application of U.S. Ser. No. 09/621,620, filed Jul. 21, 2000, now U.S. Pat. No. 6,307,231 which is a divisional application of U.S. Ser. No. 09/137,508, filed Aug. 20, 1998, now U.S. Pat No. 6,168,966.

FIELD OF THE INVENTION

The present invention relates to a semiconductor device and, more particularly, to an art which can be usefully applied to a semiconductor device having a transistor element of trench gate structure.

BACKGROUND OF THE INVENTION

Power transistors (semiconductor devices) are used as switching elements for power amplification circuits, power supply circuits and the like. This kind of power transistors has a construction in which a plurality of transistor elements are electrically connected in parallel. Each of the transistor elements is constructed as, for example, a MISFET (Metal Insulator Semiconductor Field Effect Transistor) of trench gate structure. A method of fabricating a power transistor having a MISFET of trench gate structure will be described below.

First, an $n^+$-type semiconductor layer is formed over a major surface of an $n^-$-type semiconductor substrate made of single-crystal silicon by an epitaxial growth method. These $n^+$-type semiconductor substrate and $n^-$-type semiconductor layer are used as a drain region. Then, p-type impurities are introduced into the entire major surface of the $n^-$-type semiconductor layer by ion implantation to form a p-type semiconductor region to be used as a channel forming region. Then, n-type impurities are selectively introduced into the major surface of the p-type semiconductor region by ion implantation to form an $n^+$-type semiconductor region which serves as a source region.

Then, after, for example, a silicon oxide film has been formed over the major surface of the $n^-$-type semiconductor layer, patterning is applied to the silicon oxide film to form a mask having an opening above a trench forming region of the $n^-$-type semiconductor layer. Then, a trench is formed from the major surface of the $n^-$-type semiconductor layer in the depth direction thereof by using the mask as an etching mask. The formation of the trench is performed by an anisotropic dry etching method.

Then, wet etching is applied to allow the mask to recede from the top edge portion of the trench (the portion of intersection of the side surface of the trench and the major surface of the $n^-$-type semiconductor layer). Then, isotropic dry etching is applied to form the top edge portion and the bottom edge portion (the portion of intersection of the side surface of the trench and the bottom surface thereof) of the trench into gently-sloping shapes, respectively. Then, the mask is removed.

Then, thermal oxidation is applied to form a sacrifice thermal oxide film over the internal surface of the trench, and then the sacrifice thermal oxide film is removed. The formation and the removal of the sacrifice thermal oxide film are performed for the purpose of removing defects, strain, contamination and the like which are produced when the trench is formed.

Then, thermal oxidation is applied to form a gate insulating film comprising a thermal oxide film over the internal surface of the trench. Then, a polycrystalline silicon film is formed over the entire major surface of the $n^-$-type semiconductor layer, inclusive of the inside of the trench, by a chemical vapor deposition method. Impurities for decreasing the resistance value of the polycrystalline silicon film are introduced into the polycrystalline silicon film during or after the deposition thereof.

Then, etchback is applied to flatten the surface of the polycrystalline silicon film. Then, etching is selectively applied to the polycrystalline silicon film to form a gate electrode in the trench and to form a gate lead-out electrode integrated with the gate electrode, over the peripheral region of the major surface of the $n^-$-type semiconductor layer. In this step, a MISFET is formed which has a trench gate structure in which the gate electrode is formed in the trench of the $n^-$-type semiconductor layer, with the gate insulating film interposed therebetween.

Then, an interlayer insulating film is formed over the entire major surface of the $n^-$-type semiconductor layer, inclusive of the top surface of the gate electrode, and then a contact hole is formed in the interlayer insulation film. After that, a source interconnection and a gate interconnection are formed, and then a final passivation film is formed. After that, a bonding opening is formed in the final passivation film, and then a drain electrode is formed on the back of the $n^+$-type semiconductor substrate, whereby a power transistor having such a MISFET of trench gate structure is almost finished.

The MISFET having the trench gate structure constructed in this manner can be reduced in its occupation area compared to a MISFET in which its gate electrode is formed on the major surface of its semiconductor layer, with a gate insulating film interposed therebetween. Accordingly, the size and on resistance of the power transistor can be reduced.

Incidentally, a power transistor having a MISFET of trench gate structure is described in, for example, EP 666,590.

SUMMARY OF THE INVENTION

The present inventors have examined the above-described power transistor (semiconductor device) and found out the following problems.

In the case of the above-described power transistor, the p-type semiconductor region which serves as the channel forming region is formed in the $n^-$-type semiconductor layer which serves as the drain region, and the $n^+$-type semiconductor region which serves as the source region is formed in the p-type semiconductor region, and after the trench has been formed in the $n^-$-type semiconductor layer, thermal oxidation is applied to form the thermal oxide film which serves as the gate insulating film, over the internal surface of the trench. Therefore, impurities in the p-type semiconductor region (for example, boron (B)) or impurities of the $n^+$-type semiconductor region (for example, arsenic $(As)^t$) is introduced into the thermal oxide film and the breakdown voltage of the gate insulating film becomes easily degraded, so that the reliability of the power transistor lowers.

Further, impurities in the p-type semiconductor region at the side surface of the trench migrate into the thermal oxide film and a variation occurs in the impurity concentration in the channel forming region at the side surface of the trench, so that a variation occurs in the threshold voltage (Vth) of the MISFET and FET characteristics cannot be provided stably with good reproducibilty.

In addition, impurities of the $n^+$-type semiconductor region which serves as the source region undergo enhanced diffusion by the thermal treatment temperature during the formation of the thermal oxide film, and the effective channel length of the MISFET is shortened and the punch-through breakdown voltage thereof is lowered. If the thermal oxide film is formed at a low thermal treatment temperature of approximately 950° C., enhanced diffusion of impurities in the n+-type semiconductor substrate which serves as the source region can be suppressed and the punch-through breakdown voltage of the MISFET can be ensured. However, if the thermal oxide film is formed at such a low thermal treatment temperature, the top edge portion of the trench is deformed into an angular shape by a compressive stress produced during the growth of the thermal oxide film, the film thickness of the thermal oxide film at the top edge portion becomes locally thin, so that the gate breakdown voltage of the MISFET is lowered. Therefore, if the thermal oxide film is formed at a high thermal treatment temperature of approximately 1,100° C., the deformation of the top edge portion of the trench can be suppressed and the gate breakdown voltage of the MISFET can be ensured. However, if the thermal oxide film is formed at a high thermal treatment temperature of approximately 1,100° C., as described above, impurities in the n+-type semiconductor substrate which serves as the source region undergo enhanced diffusion and the punch-through breakdown voltage of the MISFET is lowered. In other words, since neither the punch-through breakdown voltage nor the gate breakdown voltage of the MISFET can be ensured, the reliability of the power transistor is lowered.

An object of the present invention is to provide an art capable of increasing the reliability of a semiconductor device and providing stable FET characteristics of good reproducibility.

The above and other objects and novel features of the present invention will become apparent from the following description taken in conjunction with the accompanying drawings.

Representative aspects of the invention disclosed herein will be described below in brief.

In a method of fabricating a semiconductor device having a MISFET of trench gate structure, a trench is formed from a major surface of a semiconductor layer of first conductivity type which serves as a drain region, in the depth direction of the semiconductor layer, a gate insulating film comprising a thermal oxide film and a deposition film is formed over the internal surface of the trench, and after a gate electrode has been formed in the trench, impurities are introduced into the semiconductor substrate of first conductivity type to form a semiconductor region of second conductivity type which serves as a channel forming region, and impurities are introduced into the second conductivity type semiconductor region to form a semiconductor region of first conductivity type which serves as a source region. The formation of the thermal oxide film is performed in an oxygen gas atmosphere or in a water vapor atmosphere, and the formation of the deposition film is performed with a chemical vapor deposition method. The deposited film is a silicon oxide film or a silicon nitride film or an acid nitride film.

According to the above-described means, after the thermal oxide film which serves as the gate insulating film has been formed, the semiconductor region of second conductivity type which serves as the channel forming region and the semiconductor region of first conductivity type which serves as the source region are formed. Accordingly, neither impurities in the semiconductor region of second conductivity type nor the impurity of the of semiconductor region of first conductivity type is introduced into the thermal oxide film, and the degradation of the breakdown voltage of the gate insulating film due to the introduction of such impurities can be suppressed. In consequence, the reliability of the semiconductor device can be improved.

In addition, since the semiconductor region of first conductivity type which serves as the channel forming region is formed after the thermal oxide film which serves as the gate insulating film has been formed, impurities in the semiconductor region of second conductivity type at the side surface of the trench is not introduced into the thermal oxide film, and variation in the threshold voltage (Vth) of the MISFET due to the variation of the impurity concentration of the channel forming region can be suppressed. In consequence, stable FET characteristics can be obtained with good reproducibility.

In addition, since the semiconductor region of first conductivity type which serves as the source region is formed after the thermal oxide film which serves as the gate insulating film has been formed, even if the formation of the thermal oxide film is performed at a high thermal oxidation temperature of approximately 1,100° C., impurities in the semiconductor region of first conductivity type undergo enhanced diffusion, whereby reduction in effective channel length can be suppressed and the punch-through breakdown voltage of the MISFET can be ensured. In addition, the formation of the thermal oxide film is performed at a low thermal oxidation temperature of approximately 950° C., and even if the top edge portion of the trench (the portion of intersection of the side surface of the trench and the major surface of the semiconductor layer of first conductivity type) is deformed into an angular shape by a compressive stress produced during the growth of the thermal oxide film, and the film thickness of the thermal oxide film at the top edge portion becomes locally thin, the locally thin portion can be compensated for by the deposited film, and therefore the gate breakdown voltage of the MISFET can be ensured. In consequence, it is possible to improve the reliability of the power transistor (semiconductor device).

DESCRIPTION OF THE PREFERRED EMBODIMENTS

Figure 1:
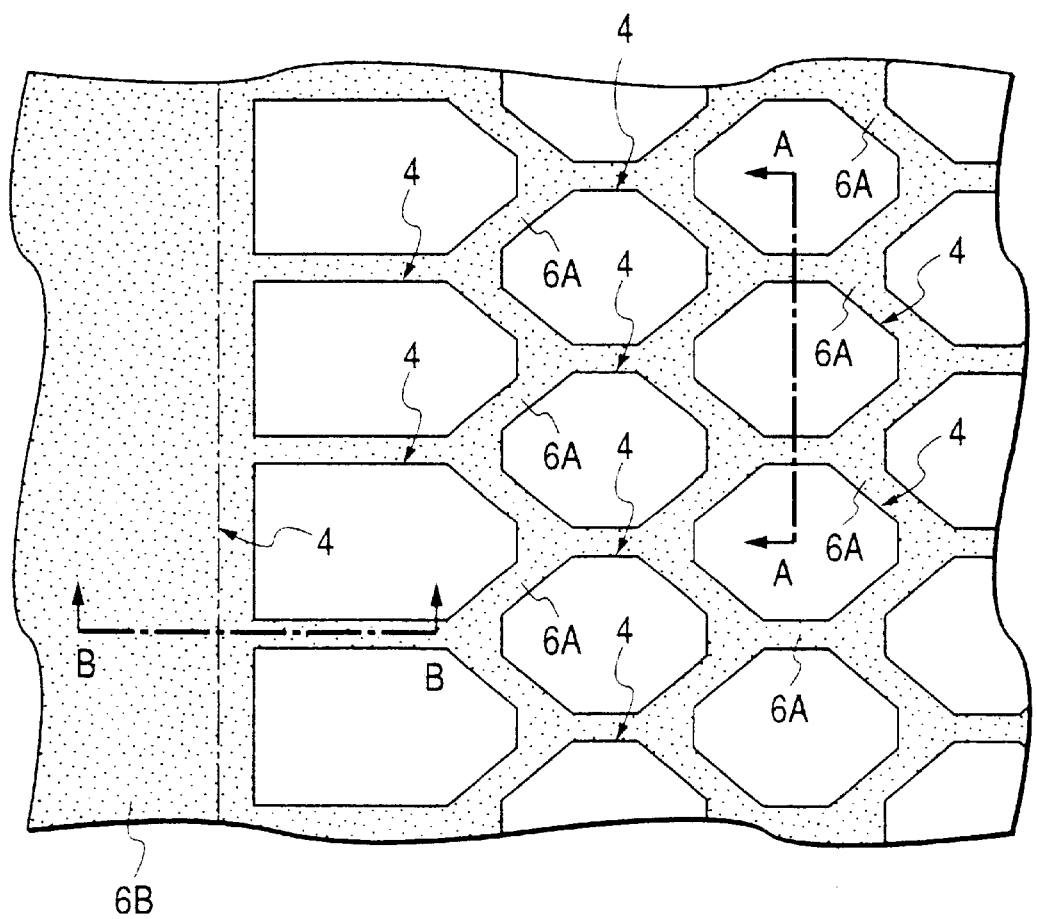
FIG. 1 is a plan view showing the essential portion of a power transistor (semiconductor device) of a first embodiment according to the present invention.

Preferred embodiments of the present invention will be described below in detail with reference to the accompanying drawings. Throughout all the drawings for illustrating the preferred embodiments of the present invention, identical reference numerals denote constituent portions having identical functions, and the repetition of the same description will be omitted.

(First Embodiment)

Figure 2:
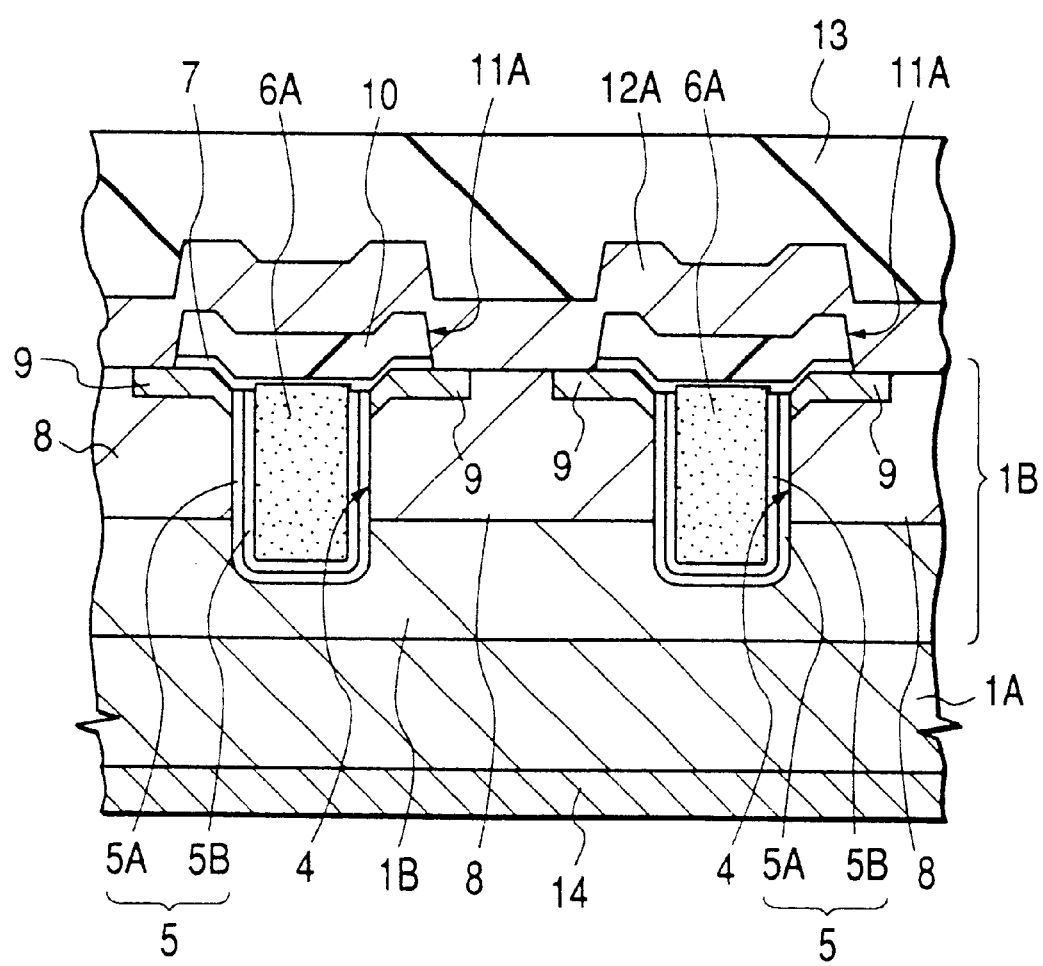
FIG. 2 is a cross-sectional view taken along the line A—A shown in FIG. 1.
Figure 3:
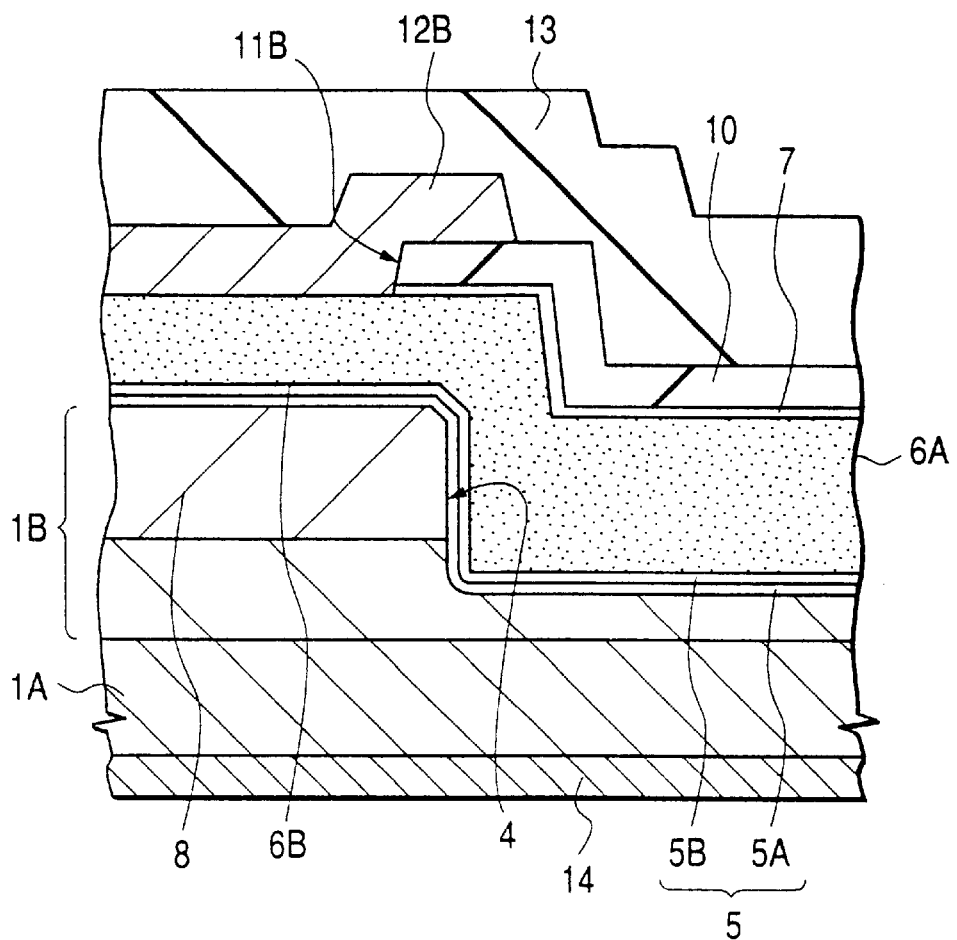
FIG. 3 is a cross-sectional view taken along the line B—B shown in FIG. 1.

FIG. 1 is a plan view showing the essential portion of a power transistor (semiconductor device) of a first embodiment according to the present invention. FIG. 2 is a cross-sectional view taken along the line A—A shown in FIG. 1, and FIG. 3 is a cross-sectional view taken along the line B—B shown in FIG. 1. In FIG. 1, a source interconnection 12A, a gate interconnection 12B, a final passivation film 13 and the like, all of which will be described later, are not shown for the sake of simplicity of illustration. In FIGS. 2 and 3, hatching (slant lines) indicative of a cross section is partly omitted for the sake of simplicity of illustration.

As shown in FIGS. 1 and 2, the power transistor of the first embodiment includes as its principal body a semiconductor base in which, for example, an $n^-$-type semiconductor layer 1B is formed over a major surface of an $n^+$-type semiconductor substrate 1A made of single-crystal silicon. The $n^-$-type semiconductor layer 1B is formed by, for example, an epitaxial growth method, and is made of single-crystal silicon.

A plurality of transistor elements are formed in the semiconductor base, and are electrically connected in parallel. The transistor elements of the first embodiment are MISFETs.

Each of the MISFETs principally includes a channel forming region, a gate insulating film 5, a gate electrode 6A, a source region and a drain region. The channel forming region comprises a p-type semiconductor region 8 formed in an $n^-$-type semiconductor layer 1B. The source region comprises an $n^+$-type semiconductor region 9 formed in the p-type semiconductor region 8. The drain region comprises an $n^+$-type semiconductor substrate 1A and the $n^-$-type semiconductor layer 1B. The gate insulating film 5 is formed on the internal surface of a trench 4 which is formed from the major surface of the $n^-$-type semiconductor layer 1B in the depth direction thereof. The gate electrode 6A comprises a conductive film buried in the trench 4, with the gate insulating film 5 interposed therebetween. The conductive film comprises, for example, a polycrystalline silicon film in which impurities for decreasing the resistance value is introduced. In other words, the MISFET has a vertical structure in which the source region, the channel forming region and the drain region are disposed in that order from the major surface of the $n^-$-type semiconductor layer 1B in the depth direction thereof, and further has a trench gate structure in which the gate insulating film 5 and the gate electrode 6A are formed in the trench 4 formed in the $n^-$-type semiconductor layer 1B. In addition, the MISFET is of an n-channel conductivity type in which the p-type semiconductor region 8 at side surface of the trench 4 is used as the channel forming region.

The gate insulating film 5 of the MISFET is, but not limited to, a multilayer film in which, for example, a thermal oxide film 5A and a deposited film 5B are disposed in that order from the internal surface of the trench 4. The thermal oxide film 5A is formed with a film thickness of, for example, approximately 20 nm, and the deposited film 5B is formed with a film thickness of, for example, approximately 50 nm. The thermal oxide film 5A is formed by forming the trench 4 in the $n^-$-type semiconductor layer 1B and then conducting a heat treatment of approximately 950° C. in an oxygen gas atmosphere or a water vapor atmosphere. The deposited film 5B is a silicon oxide film deposited by, for example, a chemical vapor deposition method. This silicon oxide film is formed by causing silane ($SiH_4$) to react with oxygen ($O_2$) in an atmosphere with a temperature of, for example, approximately 800° C.

The element forming region of the major surface of the $n^-$-type semiconductor layer 1B is divided into a plurality of island regions by the trench 4. These island regions are regularly disposed in a matrix, and each of the island regions has a flat octagonal shape in plan view. In other words, the trench 4 is formed in such a pattern that the element forming region of the major surface of the $n^-$-type semiconductor layer 1B is divided into the plurality of island regions and each of these island regions has the flat octagonal shape in plan view. Incidentally, the $n^+$-type semiconductor region 9 which serves as the source region of the MISFETs is formed over the major surface of each of the island regions into which the element forming region of the $n^-$-type semiconductor layer 1B is divided by the trench 4.

The top edge portion of the trench 4 (the portion of intersection of the side surface of the trench 4 and the major surface of the $n^-$-type semiconductor layer 1B) and the bottom edge portion of the trench 4 (the portion of intersection of the side surface of the trench 4 and the bottom surface thereof) have gently-sloping shapes. The shapes of the top edge portion and the bottom edge portion of the trench 4 are formed by forming the trench 4 in the $n^-$-type semiconductor layer 1B and then applying chemical dry etching using a mixture gas of a chlorine gas and an oxygen gas.

The source interconnection 12A is electrically connected to each of the $n^+$-type semiconductor region 9 and the p-type semiconductor region 8 through a contact hole 11A formed in an interlayer insulation film 10. The interlayer insulation film 10 is provided between the gate electrode 6A and the source interconnection 12A and electrically isolates the gate electrode 6A and the source interconnection 12A from each other. The source interconnection 12A is, for example, an aluminum (Al) film or an aluminum alloy film. An insulating film 7 is provided between the gate electrode 6A and the interlayer insulation film 10.

As shown in FIGS. 1 and 3, the gate electrode 6A is extended to a peripheral region of the major surface of the n-type semiconductor layer 1, and is integrated with a gate lead-out electrode 6B formed over the major surface in the peripheral region. The gate interconnection 12B is electrically connected to the gate lead-out electrode 6B through a contact hole 11B formed in the interlayer insulation film 10. The gate interconnection 12B is formed in the same layer as the source interconnection 12A, and is electrically isolated therefrom.

As shown in FIGS. 2 and 3, a final passivation film 13 is formed over the entire major surface of the n⁻-type semiconductor layer 1B, inclusive of the top surface of the source interconnection 12A and the top surface of the gate interconnection 12B. The final passivation film 13 is, for example, a silicon oxide film deposited by a plasma chemical vapor deposition method which uses a tetraethoxysilane (TEOS) gas as the principal component of a source gas.

Incidentally, a bonding opening in which the surface of the source interconnection 12A is partly exposed is formed in the final passivation film 13, and further, a bonding opening in which the surface of the gate interconnection 12B is partly exposed is formed in the final passivation film 13.

A drain electrode 14 is formed over the back of the n-type semiconductor layer 1.

A method of fabricating the above-described power transistor will be described below with reference to FIGS. 4 to 14 (which are cross-sectional views for illustrating the method of fabricating the power transistor). Throughout FIGS. 8 to 14, hatching (slant lines) indicative of a cross section is partly omitted for the sake of simplicity of illustration.

First, the n⁺-type semiconductor substrate 1A made of single-crystal silicon is prepared. The impurity concentration of the n⁺-type semiconductor substrate 1A is set to approximately $2 \times 10^{19}$ atoms/cm³. For example, arsenic (As) is introduced as impurities.

Figure 4:
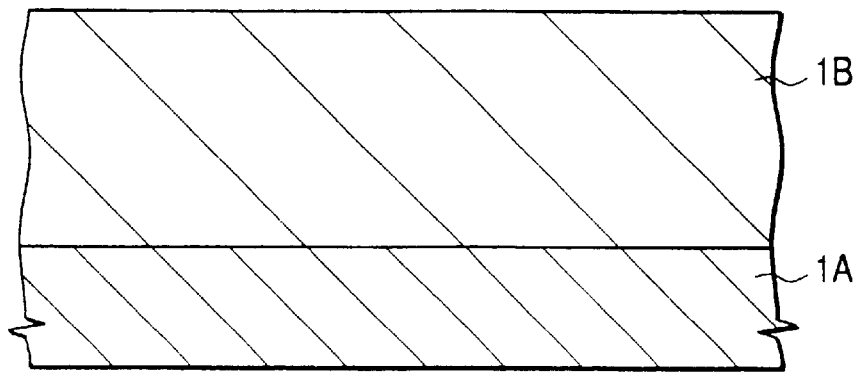
FIG. 4 is a cross-sectional view for illustrating a method of fabricating the power transistor.

Then, as shown in FIG. 4, the n⁻-type semiconductor layer 1B is formed over the major surface of the n⁺-type semiconductor substrate 1A by an epitaxial growth method. The n⁻-type semiconductor layer 1B is so formed as to have, for example, a resistivity value of approximately 0.4 Ωcm and a thickness of approximately 6 μm. In this step, the n-type semiconductor layer 1 which includes the n⁺-type semiconductor substrate 1A and the n⁻-type semiconductor layer 1B is formed.

Then, a silicon oxide film having a film thickness of approximately 500 nm is formed over the major surface of the n⁻-type semiconductor layer 1B. This silicon oxide film is formed by, for example, a thermal oxidation method.

Figure 5:
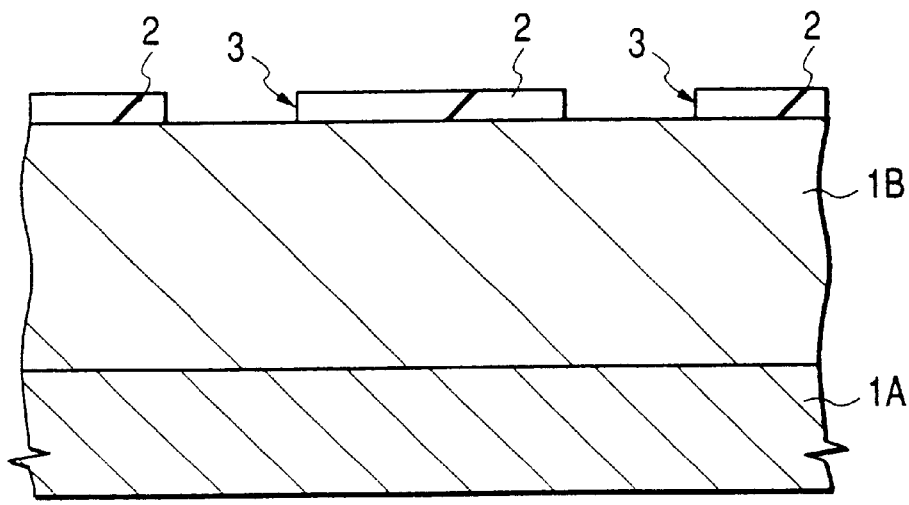
FIG. 5 is a cross-sectional view for illustrating the method of fabricating the power transistor.

Then, patterning is applied to the silicon oxide film to form a mask 2 having an opening 3 above a trench forming region of the n⁻-type semiconductor layer 1B, as shown in FIG. 5. This mask 2 is formed in a pattern in which each region defined by the opening 3 has a flat octagonal shape in plan view in the element forming region of the major surface of the n⁻-type semiconductor layer 1B.

Figure 6:
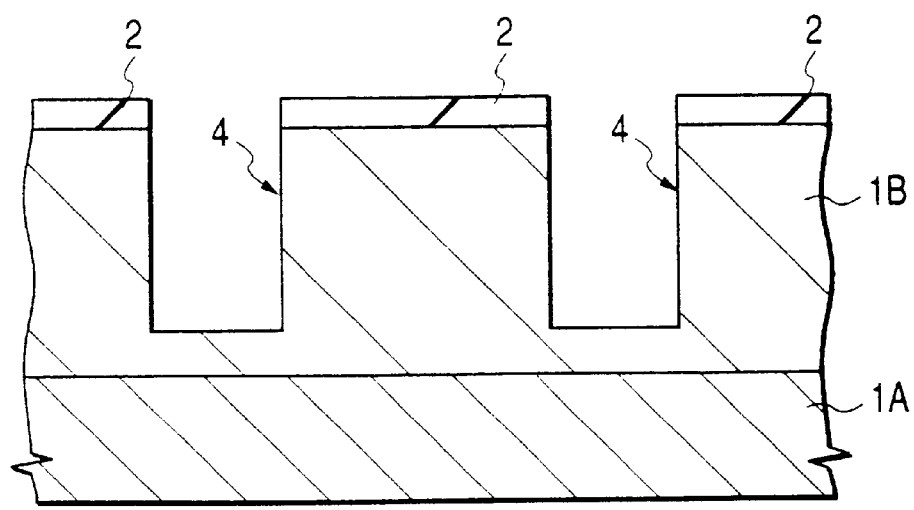
FIG. 6 is a cross-sectional view for illustrating the method of fabricating the power transistor.

Then, the trench 4 is formed from the major surface of the n⁻-type semiconductor layer 1B in the depth direction thereof as shown in FIG. 6, by using the mask 2 as an etching mask. The formation of the trench 4 is performed by an anisotropic dry etching method which uses, for example, a chlorine gas or a hydrogen bromide gas and RF (Radio Frequency) power of high level. The trench 4 is so formed as to have a depth of approximately 1.5–2 μm and a width of approximately 0.5–2 μm.

Then, wet etching is applied to allow the mask 2 to recede by approximately 200 nm from the top edge portion of the trench 4 (the portion of intersection of the side surface of the trench 4 and the major surface of the n⁻-type semiconductor layer 1B).

Figure 7:
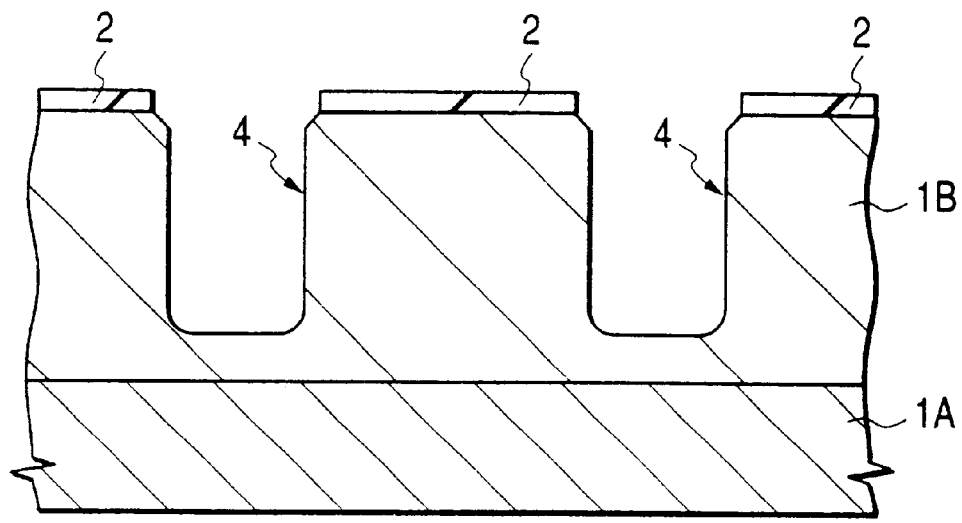
FIG. 7 is a cross-sectional view for illustrating the method of fabricating the power transistor.

Then, as shown in FIG. 7, chemical dry etching using a mixture gas of a chlorine gas and an oxygen gas is applied to form the top edge portion and the bottom edge portion (the portion of intersection of the side surface and the bottom surface of the trench 4) of the trench 4 into gently-sloping (rounded) shapes. In this step, the trench 4 having the top and bottom edge portions of gently-sloping shapes is obtained. After that, the mask 2 is removed.

Then, thermal oxidation is applied to form a sacrifice thermal oxide film having a film thickness of approximately 100 nm over the internal surface of the trench 4, and then the sacrifice thermal oxide film is removed. The formation and the removal of the sacrifice thermal oxide film are performed for the purpose of removing defects, strain, contamination and the like produced when the trench 4 is formed. The formation of the sacrifice thermal oxide film is performed in an oxygen gas atmosphere at a high temperature of approximately 1,100° C. If the formation of the sacrifice thermal oxide film is performed at a low thermal oxidation temperature of approximately 950° C., the top edge portion of the trench 4 which has been formed into a gently-sloping shape in the previous step will be deformed into an angular shape by a compressive stress produced during the growth of the sacrifice thermal oxide film. The reason is that the formation of the sacrifice thermal oxide film is, performed at a thermal oxidation temperature of 1,000° C. or more. Incidentally, the formation of the sacrifice thermal oxide film may also be performed in an oxygen gas atmosphere diluted with a nitrogen gas.

Figure 8:
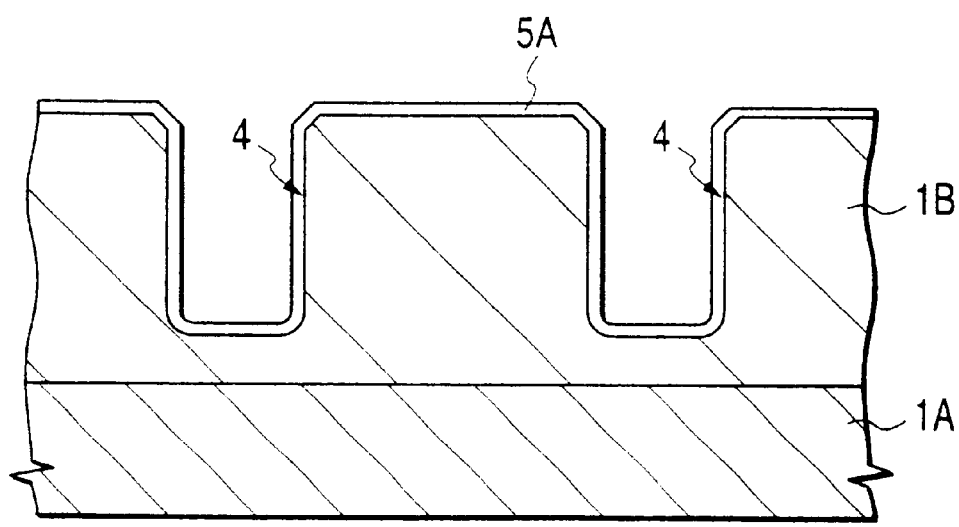
FIG. 8 is a cross-sectional view for illustrating the method of fabricating the power transistor.
Figure 9:
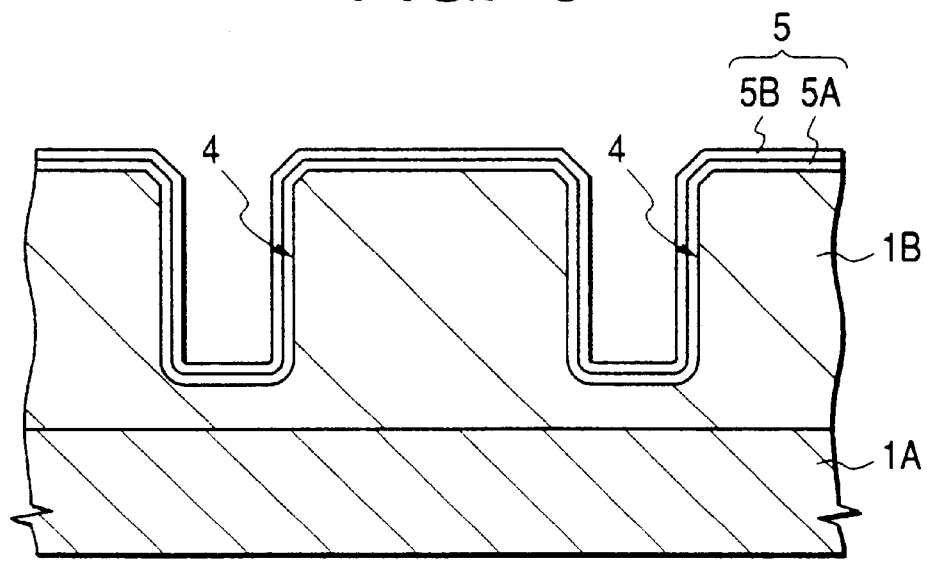
FIG. 9 is a cross-sectional view for illustrating the method of fabricating the power transistor.

Then, thermal oxidation is applied to form the thermal oxide film 5A having a film thickness of approximately 20 nm over the internal surface of the trench 4 as shown in FIG. 8. After that, as shown in FIG. 9, the deposition film 5B made of silicon oxide and having a film thickness of approximately 50 nm is deposited over the surface of the thermal oxide film 5A by a chemical vapor deposition method, thereby forming the gate insulating film 5. The formation of the thermal oxide film 5A is performed in an oxygen gas atmosphere or a water vapor atmosphere having a low temperature of approximately 950° C. The deposition of the deposition film 5B is performed in a temperature atmosphere having a low temperature of approximately 950° C. In this step of forming the gate insulating film 5, since the formation of the thermal oxide film 5A is performed at a low thermal oxidation temperature of approximately 950° C., the top edge portion of the trench 4 (the portion of intersection of the side surface of the trench 4 and the major surface of the n⁻-type semiconductor layer 1B) which has been formed into a gently-sloping shape in the previous step is deformed into an angular shape by a compressive stress produced during the growth of the thermal oxide film 5A and the film thickness of the thermal oxide film 5A at the top edge portion becomes locally thin. However, since that locally thin portion is compensated for by the deposition film 5B, the breakdown voltage of the gate insulating film 5 is ensured.

Then, for example, a polycrystalline silicon film is formed as a conductive film over the entire major surface of the n$^-$-type semiconductor layer 1B, inclusive of the inside of the trench 4, by a chemical vapor deposition method. Impurities for decreasing the resistance value (for example, phosphorus (P)) are introduced into the polycrystalline silicon film during or after the deposition thereof. The polycrystalline silicon film is so formed as to have a film thickness of, for example, approximately 1 μm.

The surface of the polycrystalline silicon is flattened. This flattening is performed by, for example, an etchback method or a chemical mechanical polishing (CMP) method.

Figure 10:
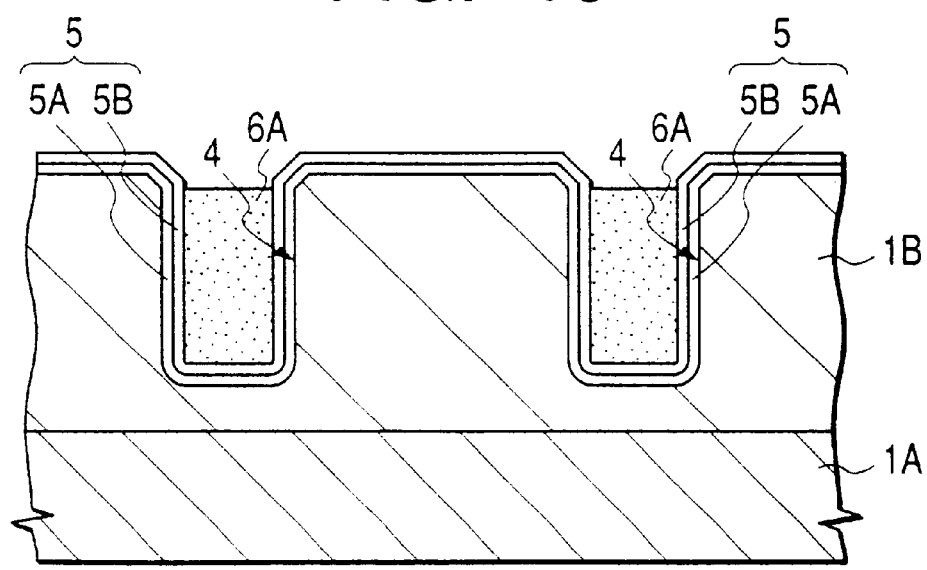
FIG. 10 is a cross-sectional view for illustrating the method of fabricating the power transistor.

Then, etching is selectively applied to the polycrystalline silicon film to form the gate electrode 6A in the trench 4 as shown in FIG. 10 and to form the gate lead-out electrode 6B (shown in FIG. 3) integrated with the gate electrode 6A, over the peripheral region of the major surface of the n$^-$-type semiconductor layer 1B.

Figure 11:
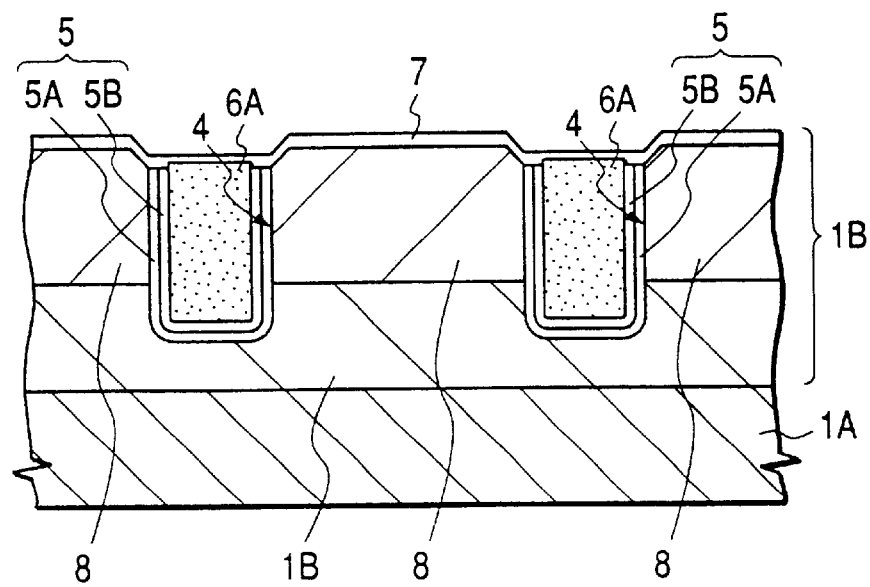
FIG. 11 is a cross-sectional view for illustrating the method of fabricating the power transistor.

Then, after the deposition film 5B and the thermal oxide film 5A which remain on the major surface of the n$^-$-type semiconductor layer 1B have been removed, the insulating film 7 made of, for example, silicon oxide is formed over the entire major surface of the n$^-$-type semiconductor layer 1B, inclusive of the top surface of the gate electrode 6A and the top surface of the gate lead-out electrode 6B, as shown in FIG. 11. The formation of the insulating film 7 is performed by a thermal oxidation method or a chemical vapor deposition method.

Then, after a p-type impurity (for example, boron) has been introduced into the entire major surface of the n$^-$-type semiconductor layer 1B by ion implantation, stretched diffusion process is conducted to form the p-type semiconductor region 8 which serves as the channel forming region, as shown in FIG. 11. The stretched diffusion process is performed for about one hour in an N$_2$ gas atmosphere having a temperature of approximately 1,100° C.

Figure 12:
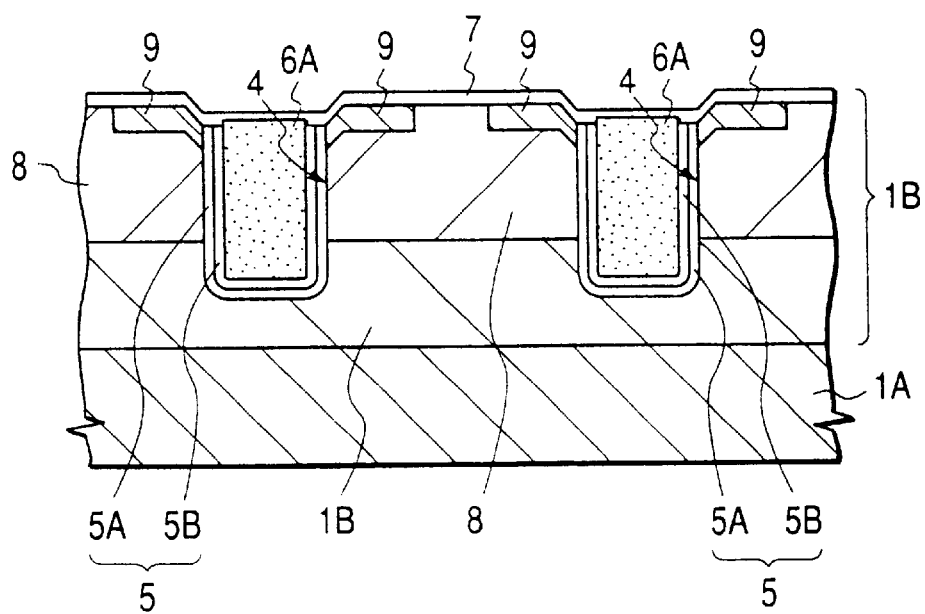
FIG. 12 is a cross-sectional view for illustrating the method of fabricating the power transistor.

Then, after an n-type impurity (for example, arsenic) has been selectively introduced into a major surface of the p-type semiconductor region 8 which constitutes the major surface of the n$^-$-type semiconductor layer 1B, by ion implantation, annealing is performed at a temperature of 950° C. for about 20 minutes to form the n$^+$-type semiconductor region 9 which serves as a source region, as shown in FIG. 12. The introduction of the n-type impurity is performed under the condition that the amount of n-type impurity to be finally introduced is set to approximately 5×10$^{15}$ atoms/cm$^2$ and the amount of energy required during the introduction is set to 80 KeV. In this step, a MISFET is formed which has a trench gate structure in which the gate insulating film 5 and the gate electrode 6A are formed in the trench 4 of the n$^-$-type semiconductor layer 1B.

In the above-described steps, the p-type semiconductor region 8 which serves as the channel forming region and the n$^+$-type semiconductor substrate 9 which serves as the source region are formed after the thermal oxide film 5A which constitutes the gate insulating film 5 has been formed. Accordingly, in the step of forming the thermal oxide film 5A, neither impurities in the p-type semiconductor region 8 nor impurities in the n$^+$-type semiconductor region 9 do not migrate into the thermal oxide film 5A, and therefore it is possible to suppress degradation of the breakdown voltage of the gate insulating film 5 due to the migration of impurities.

The p-type semiconductor region 8 which serves as the channel forming region is formed after the thermal oxide film 5A which constitutes the gate insulating film 5 has been formed. Accordingly, impurities in the p-type semiconductor region 8 at the side surface of the trench 4 do not migrate into the thermal oxide film 5A, and therefore it is possible to suppress the variation in the threshold voltage (Vth) of the MISFET due to the variation of the impurity concentration in the channel forming region.

The n$^+$-type semiconductor region 9 which serves as the source region is formed after the thermal oxide film 5A which constitutes the gate insulating film 5 has been formed. Accordingly, even if the formation of the thermal oxide film 5A is performed at a high thermal oxidation temperature of approximately 1,100° C., impurities in the n$^+$-type semiconductor region 9 do not undergo enhanced diffusion whereby reduction in effective channel length can be suppressed and the punch-through breakdown voltage of the MISFET can be ensured. In addition, the formation of the thermal oxide film 5A is performed at a low thermal oxidation temperature of approximately 950° C., and even if the top edge portion of the trench 4 (the portion of intersection of the side surface of the trench 4 and the major surface of the n$^-$-type semiconductor layer 1B) is deformed into an angular shape by a compressive stress produced during the growth of the thermal oxide film 5A and the film thickness of the thermal oxide film 5A at the top edge portion becomes locally thin, that locally thin portion can be compensated for by the deposition film 5B, and therefore the gate breakdown voltage of the MISFET can be ensured.

Figure 13:
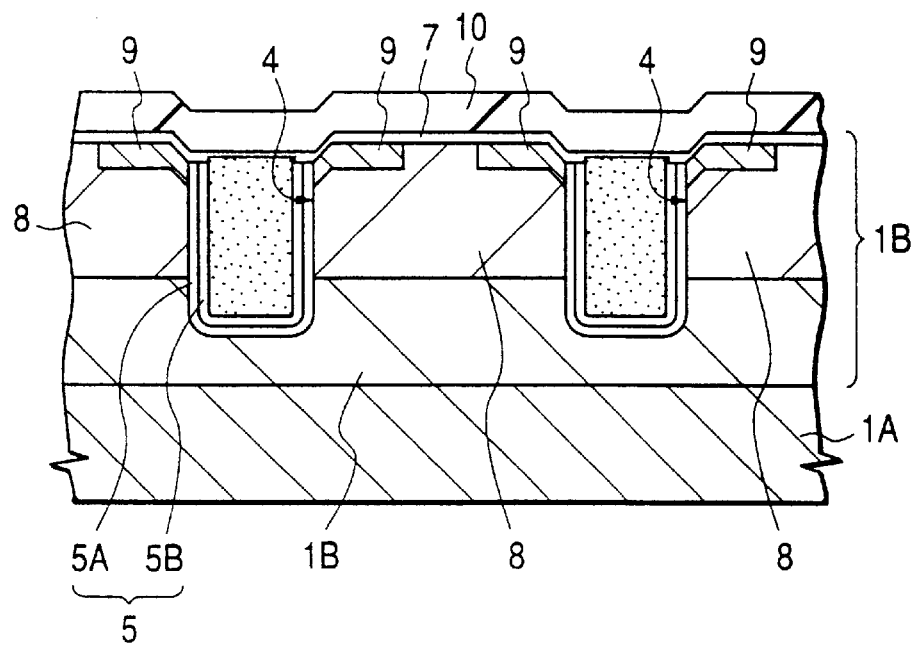
FIG. 13 is a cross-sectional view for illustrating the method of fabricating the power transistor.

Then, as shown in FIG. 13, the interlayer insulation film 10 having a film thickness of, for example, approximately 500 nm is formed over the entire surface of the n$^-$-type semiconductor layer 1B. The interlayer insulation film 10 is, for example, a BPSG (Boro Phospho Silicate Glass) film.

Figure 14:
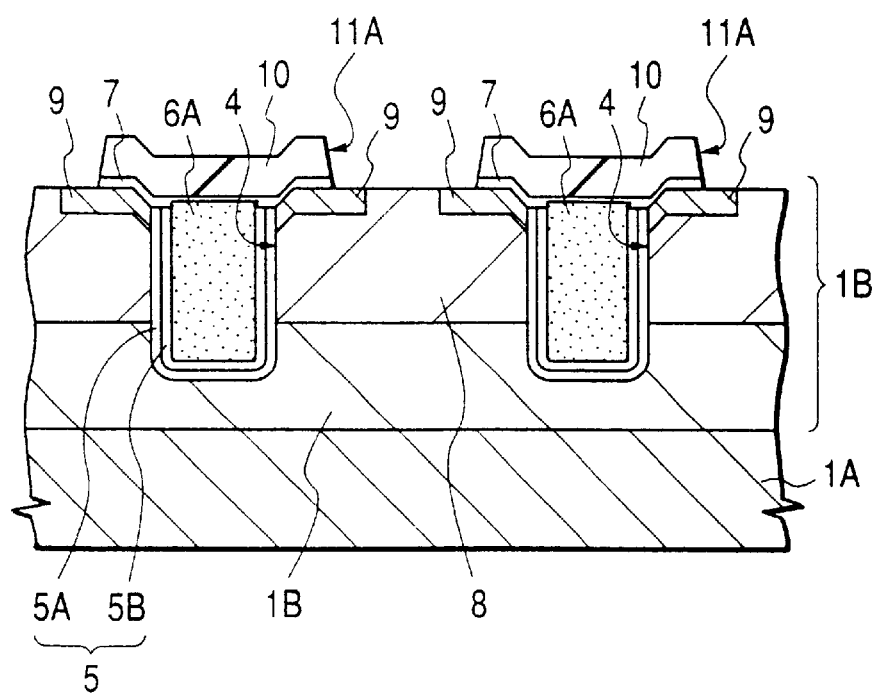
FIG. 14 is a cross-sectional view for illustrating the method of fabricating the power transistor.

Then, anisotropic dry etching using CHF$_3$ gas is performed to form the contact hole 11A and the contact hole 11B (shown in FIG. 3) in the interlayer insulation film 10, as shown in FIG. 14.

Then, after a conductive film comprising, for example, an aluminum film or an aluminum alloy film has been formed over the entire major surface of the n$^-$-type semiconductor layer 1B, inclusive of the insides of the contact holes 11A and 11B, patterning is applied to the conductive film to form the source interconnection 12A to be electrically connected to each of the p-type semiconductor region 8 and the n$^+$-type semiconductor region 9, and to form the gate interconnection 12B to be electrically connected to the gate lead-out electrode 6B.

Then, the final passivation film 13 is formed over the entire major surface of the n$^-$-type semiconductor layer 1B, inclusive of the top surface of the source interconnection 12A and the top surface of the gate lead-out electrode 6B. The final passivation film 13 is, for example, a silicon oxide film deposited by a plasma chemical vapor deposition method which uses a tetraethoxysilane (TEOS) gas as a principal component of a source gas.

Then, a bonding opening in which the surface of a part of the source interconnection 12A is exposed and a bonding opening in which the surface of a part of the gate interconnection 12B is exposed are formed in the final passivation film 13. After that, the back of the n$^+$-type semiconductor substrate 1A is ground, and then the drain electrode 14 is formed on the back of the n$^+$-type semiconductor substrate 1A. Thus, the power transistor having a MISFET having the trench gate structure is almost finished.

As is apparent from the above description, the first embodiment has the following effects.

The first embodiment is a method of fabricating a semiconductor device having a MISFET of trench gate structure, which comprises the steps of forming a trench 4 from the surface of an n⁻-type semiconductor layer 1B which serves as a drain region, in the depth direction of an n⁻-type semiconductor layer 1B, forming a gate insulating film 5 comprising a thermal oxide film 5A and a deposition film 5B over the internal surface of the trench 4, forming a gate electrode 6A in the trench 4, introducing impurities into the n⁻-type semiconductor layer 1B to form a p-type semiconductor region 8 which serves as a channel forming region, and introducing impurities into the p-type semiconductor region 8 to form an n⁺-type semiconductor region 9 which serves as a source region.

In this method, after the thermal oxide film 5A which constitutes the gate insulating film 5 has been formed, the p-type semiconductor region 8 which serves as the channel forming region and the n⁺-type semiconductor region 9 which serves as the source region are formed. Accordingly, neither impurities in the p-type semiconductor region 8 nor impurities in the n⁺-type semiconductor region 9 migrate into the thermal oxide film 5A, and therefore it is possible to suppress degradation of the breakdown voltage of the gate insulating film 5 due to the introduction of impurities. In consequence, it is possible to improve the reliability of the power transistor (semiconductor device).

In addition, since the p-type semiconductor region 8 which serves as the channel forming region is formed after the thermal oxide film 5A which constitutes the gate insulating film 5 has been formed, impurities in the p-type semiconductor region 8 which at the side surface of the trench 4 do not migrate into the thermal oxide film 5A, and therefore it is possible to suppress the variation in the threshold voltage (Vth) of the MISFET due to the variation of the impurity concentration in the channel forming region. In consequence, it is possible to obtain stable FET characteristics with good reproducibility.

In addition, since the n⁺-type semiconductor region 9 which serves as the source region is formed after the thermal oxide film 5A which constitutes the gate insulating film 5 has been formed, even if the formation of the thermal oxide film 5A is performed at a high thermal oxidation temperature of approximately 1,100° C., impurities in the n⁺-type semiconductor region 9 do not undergo enhanced diffusion, whereby reduction in effective channel length can be suppressed and the punch-through breakdown voltage of the MISFET can be ensured. In addition, the formation of the thermal oxide film 5A is performed at a low thermal oxidation temperature of approximately 950° C., and even if the top edge portion of the trench 4 (the portion of intersection of the side surface of the trench 4 and the major surface of the n⁻-type semiconductor layer 1B) is deformed into an angular shape by a compressive stress produced during the growth of the thermal oxide film 5A and the film thickness of the thermal oxide film 5A at the top edge portion becomes locally thin, that locally thin portion can be compensated for by the deposition film 5B, and therefore the gate breakdown voltage of the MISFET can be ensured. In consequence, it is possible to improve the reliability of the power transistor (semiconductor device).

Incidentally, although the first embodiment has been described with reference to the example in which the deposition film 5B comprises a silicon oxide film, the deposition film 5B may also be a silicon nitride film or an acid nitride film.

(Second Embodiment)

A second embodiment will be described, taking an example in which a mask to be used as an etching mask during the formation of a trench is a multilayer film including a silicon oxide film, a silicon nitride film and a silicon oxide film. The reason why the mask is such multilayer film is that if the mask to be used as an etching mask during the formation of a trench is a single-layer film of silicon oxide as in the first embodiment, a hydrofluoric acid-containing etchant needs to be used for removing a reactive deposit produced during anisotropic etching and, at this time, if the film thickness of the mask 2 shown in FIG. 6 is excessively thin, the mask 2 is removed after the etching, and the process of forming the top edge portion of the trench into a gently-sloping shape by isotropic etching cannot be carried out.

In addition, under particular conditions of anisotropic etching, since reactive deposit is produced as a thin layer over the side surface of the trench, it is necessary to carry out etching using hydrofluoric acid or the like for a long time in order to remove the reactive deposited, so that there is a good possibility that a mask is absent during isotropic etching for forming the top edge portion of the trench into a gently-sloping shape. In the second embodiment, after the trench has been formed, it is possible to effect satisfactory etching using a hydrofluoric acid etchant and the like by using a silicon nitride ($Si_3N_4$) film, which is not at all etched by a hydrofluoric acid-containing etchant, as a mask material during trench formation. Accordingly, since a silicon oxide film which is a film underlying the silicon nitride film can be preserved even after isotropic etching, the top edge portion of the trench can be formed into a gently-sloping shape.

A method of fabricating a power transistor of the second embodiment according to the present invention will be described below with reference to FIGS. 15 to 26. Throughout FIGS. 19 to 26, hatching (slant lines) indicative of a cross section is partly omitted for the sake of simplicity of illustration.

First, the n⁻-type semiconductor layer 1B is formed over the major surface of the n⁺-type semiconductor substrate 1A made of single-crystal silicon, by an epitaxial growth method. The n⁻-type semiconductor layer 1B is so formed as to have, for example, a resistivity value of approximately 0.4 Ωcm and a thickness of approximately 6 μm. In this step, a semiconductor base which includes the n⁺-type semiconductor substrate 1A and the n⁻-type semiconductor layer 1B is formed.

Figure 15:
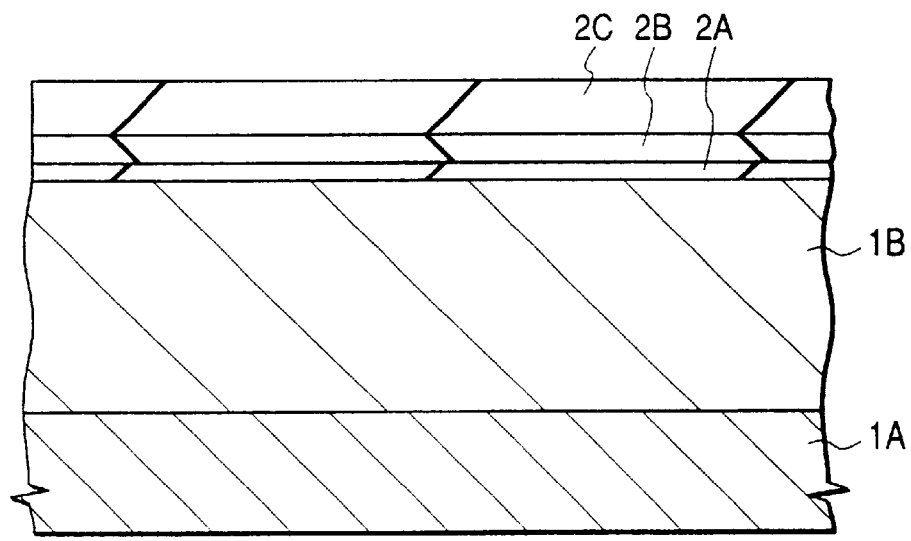
FIG. 15 is a cross-sectional view for illustrating a method of fabricating a power transistor of a second embodiment according to the present invention.

Then, as shown in FIG. 15, a silicon oxide film 2A having a film thickness of approximately 100 nm, a silicon nitride film 2B having a film thickness of approximately 200 nm and a silicon oxide film 2C having a film thickness of approximately 400 nm are formed in that order over the major surface of the n⁻-type semiconductor layer 1B. The silicon oxide film 2A is formed by a thermal oxidation method, and the silicon nitride film 2B and the silicon oxide film 2C are formed by a chemical vapor deposition method.

Figure 16:
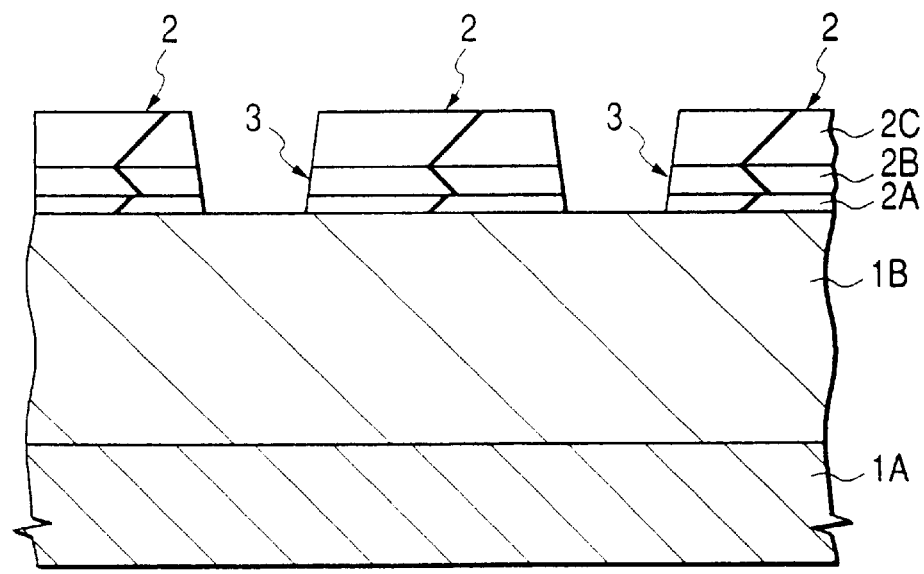
FIG. 16 is a cross-sectional view for illustrating the method of fabricating the power transistor.

Then, patterning is applied to the silicon oxide film 2C, the silicon nitride film 2B and the silicon oxide film 2A in that order by anisotropic dry etching using a gas such as $CHF_3$, thereby forming the mask 2 having the opening 3 above a trench forming region of the n⁻-type semiconductor layer 1B, as shown in FIG. 16.

Figure 17:
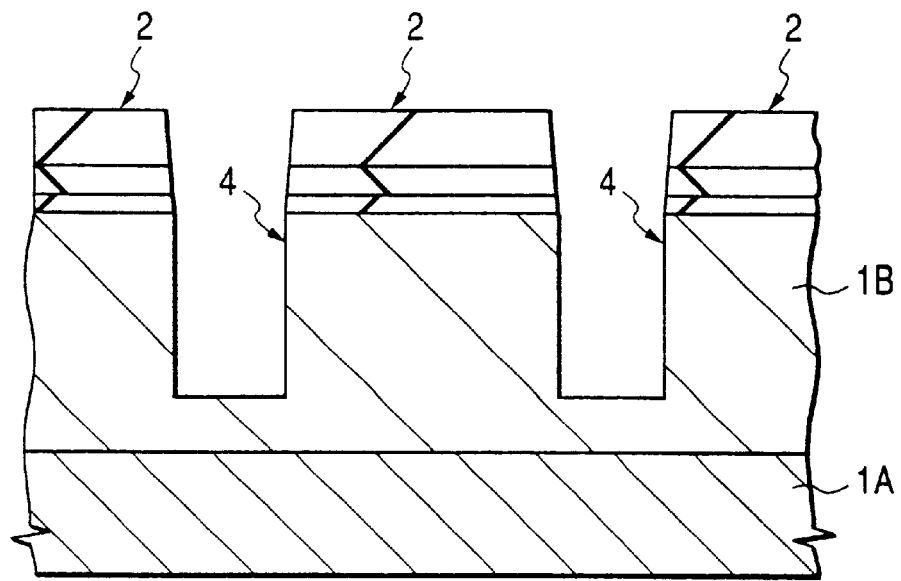
FIG. 17 is a schematic cross-sectional view for illustrating the method of fabricating the power transistor.

Then, the trench 4 is formed from the major surface of the n⁻-type semiconductor layer 1B in the depth direction thereof as shown in FIG. 17, by using the mask 2 as an etching mask. The formation of the trench 4 is performed by an anisotropic dry etching method which uses, for example, a chlorine gas or a hydrogen bromide gas and RF (Radio Frequency) power set to a high level. The trench 4 is so formed as to have a depth of approximately 1.5–2 μm and a width of approximately 0.5–2 μm.

Then, wet etching is performed to allow the silicon oxide film 2A of the mask 2 to recede by approximately 500 nm to 1 μm from the top edge portion of the trench 4 (the portion of intersection of the side surface of the trench 4 and the major surface of the n$^-$-type semiconductor layer 1B). In this step, a reactive deposit produced over the side surface of the trench 4 and the silicon oxide film 2C are completely removed, and the surface of the silicon nitride film 2B is exposed.

Figure 18:
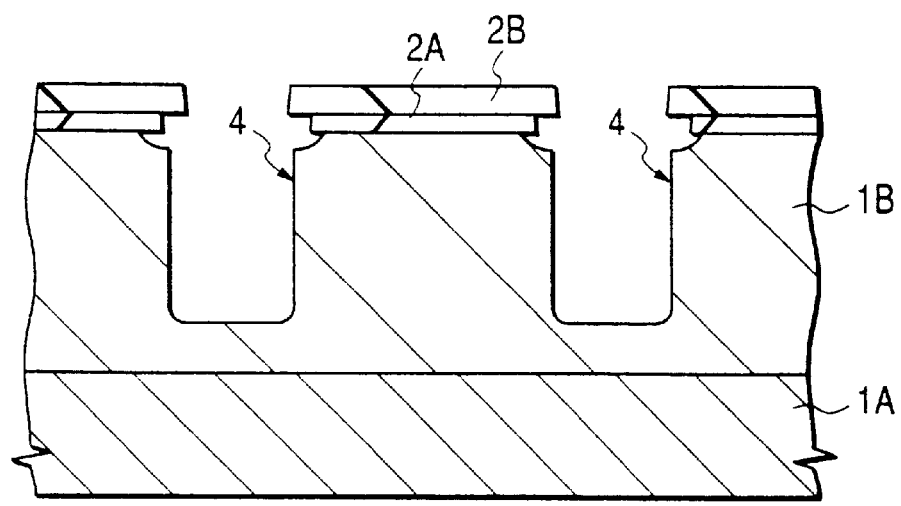
FIG. 18 is a cross-sectional view for illustrating the method of fabricating the power transistor.

Then, chemical dry etching using a mixture gas of a chlorine gas and an oxygen gas is performed to form the top edge portion and the bottom edge portion (the portion of intersection of the side surface and the bottom surface of the trench 4) of the trench 4 into gently-sloping shapes, as shown in FIG. 18. In this step, the trench 4 having the top and bottom edge portions of gently-sloping shapes is formed.

Then, thermal oxidation is conducted to form a sacrifice thermal oxide film having a film thickness of approximately 100 nm over the internal surface of the trench 4, and then the sacrifice thermal oxide film is removed. The formation of the sacrifice thermal oxide film is performed in an oxygen gas atmosphere with a high temperature of approximately 1,100° C. If the formation of the sacrifice thermal oxide film is performed at a low thermal oxidation temperature of approximately 950° C., the top edge portion of the trench 4 which has been formed into a gently-sloping shape in the previous step is deformed into an angular shape by a compressive stress produced during the growth of the sacrifice thermal oxide film. The reason is that the formation of the sacrifice thermal oxide film is performed at a thermal oxidation temperature of 1,000° C. or higher. Incidentally, the formation of the sacrifice thermal oxide film may also be performed in an oxygen gas atmosphere diluted with a nitrogen gas.

Figure 19:
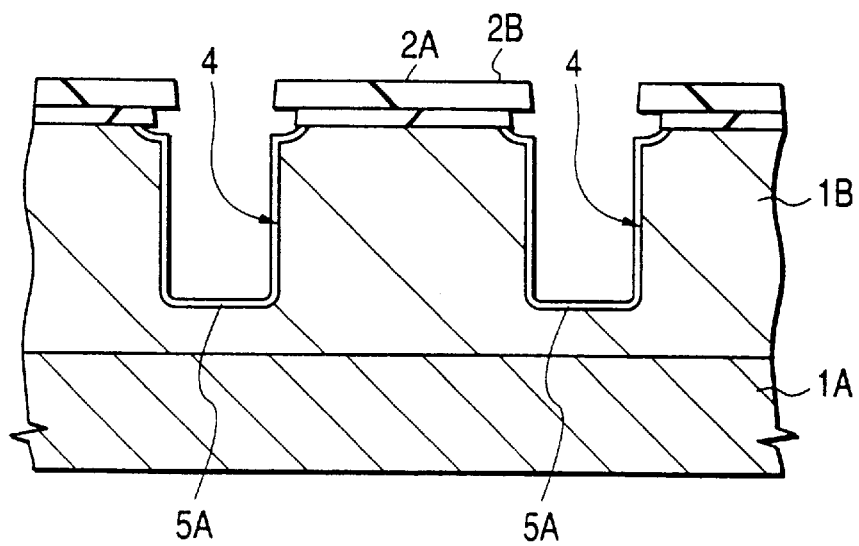
FIG. 19 is a cross-sectional view for illustrating the method of fabricating the power transistor.
Figure 20:
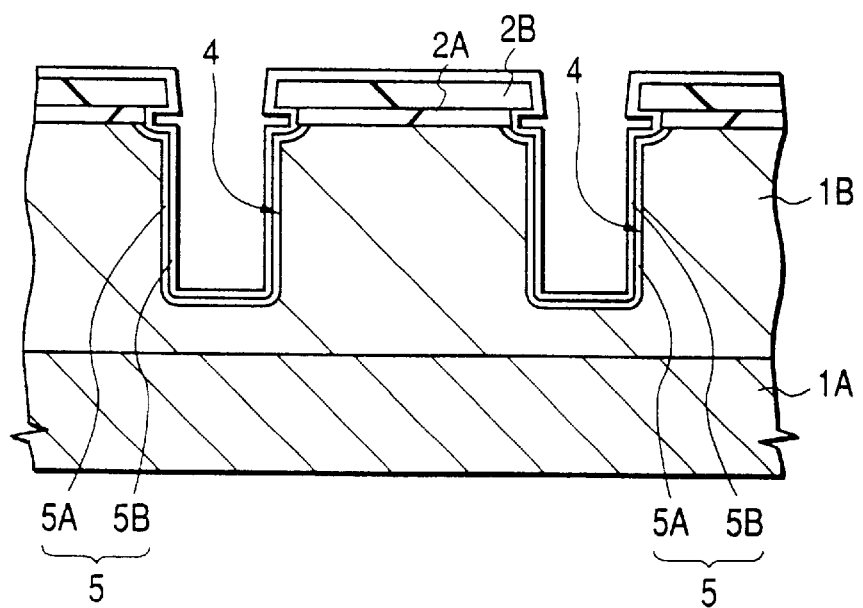
FIG. 20 is a cross-sectional view for illustrating the method of fabricating the power transistor.

Then, thermal oxidation is performed to form the thermal oxide film 5A having a film thickness of approximately 20 nm over the internal surface of the trench 4 as shown in FIG. 19. After that, as shown in FIG. 20, the deposition film 5B made of silicon oxide having a film thickness of approximately 50 nm is deposited over the surface of the thermal oxide film 5A by a chemical vapor deposition method, thereby forming the gate insulating film 5. The formation of the thermal oxide film 5A is performed in an oxygen gas atmosphere or a water vapor atmosphere of a low temperature of approximately 950° C. The deposition of the deposition film 5B is performed in a temperature atmosphere having a low temperature of approximately 800° C. In this step of forming the gate insulating film 5, since the formation of the thermal oxide film 5A is performed at a low thermal oxidation temperature of approximately 950° C., the top edge portion of the trench 4 (the portion of intersection of the side surface of the trench 4 and the major surface of the n$^-$-type semiconductor layer 1B) which has been formed into a gently-sloping shape in the previous step is deformed into an angular shape by a compressive stress produced during the growth of the thermal oxide film 5A, and the film thickness of the thermal oxide film 5A at the top edge portion becomes locally thin. However, since the locally thin portion is compensated for by the deposition film 5B, the breakdown voltage of the gate insulating film 5 is ensured.

Then, for example, a polycrystalline silicon film is formed as a conductive film over the entire major surface of the n$^-$-type semiconductor layer 1B, inclusive of the inside of the trench 4, by a chemical vapor deposition method. Impurities for decreasing the resistance value (for example, phosphorus) is introduced into the polycrystalline silicon film during or after the deposition thereof. The polycrystalline silicon film is so formed as to have a film thickness of, for example, approximately 1 μm.

Then, the surface of the polycrystalline silicon is flattened. This flattening is performed by, for example, an etchback method or a chemical mechanical polishing method.

Figure 21:
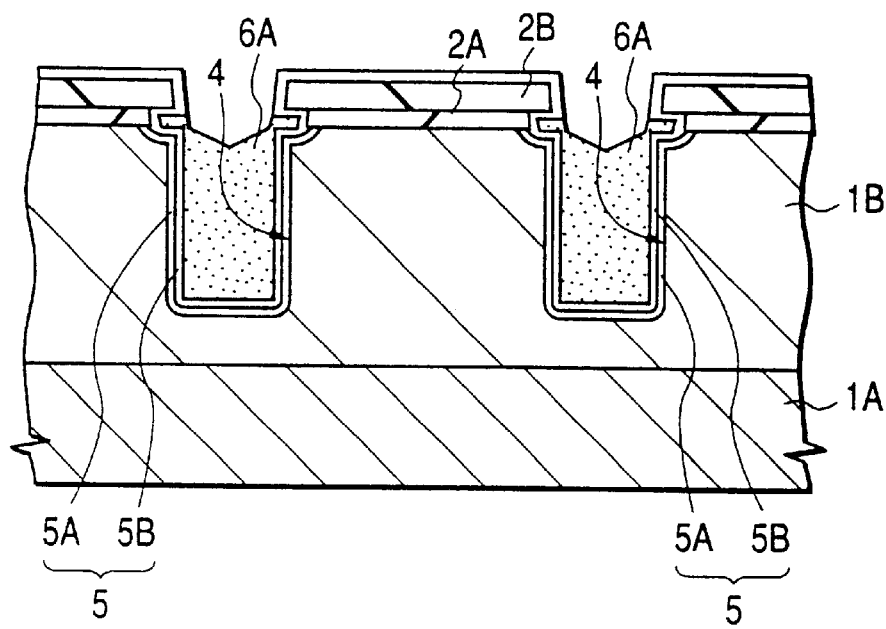
FIG. 21 is a cross-sectional view for illustrating the method of fabricating the power transistor.

Then, etching is selectively applied to the polycrystalline silicon film to form the gate electrode 6A in the trench 4 as shown in FIG. 21 and to form the gate lead-out electrode 6B (shown in FIG. 3) integrated with the gate electrode 6A, over the peripheral region of the major surface of the n$^-$-type semiconductor layer 1B.

Figure 22:
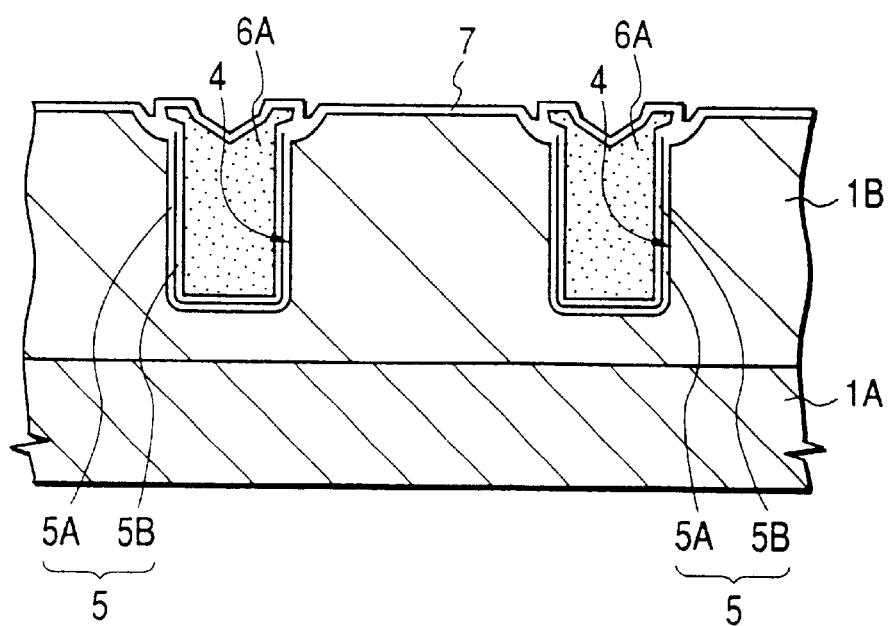
FIG. 22 is a cross-sectional view for illustrating the method of fabricating the power transistor.

Then, the deposition film 5B which remains on the major surface of the silicon nitride film 2B is removed, and further the silicon nitride film 2B is removed. After that, as shown in FIG. 22, the insulating film 7 made of, for example, silicon oxide is formed over the entire major surface of the n$^-$-type semiconductor layer 1B, inclusive of the top surface of the gate electrode 6A and the top surface of the gate lead-out electrode 6B. The formation of the insulating film 7 is performed by a thermal oxidation method or a chemical vapor deposition method.

Figure 23:
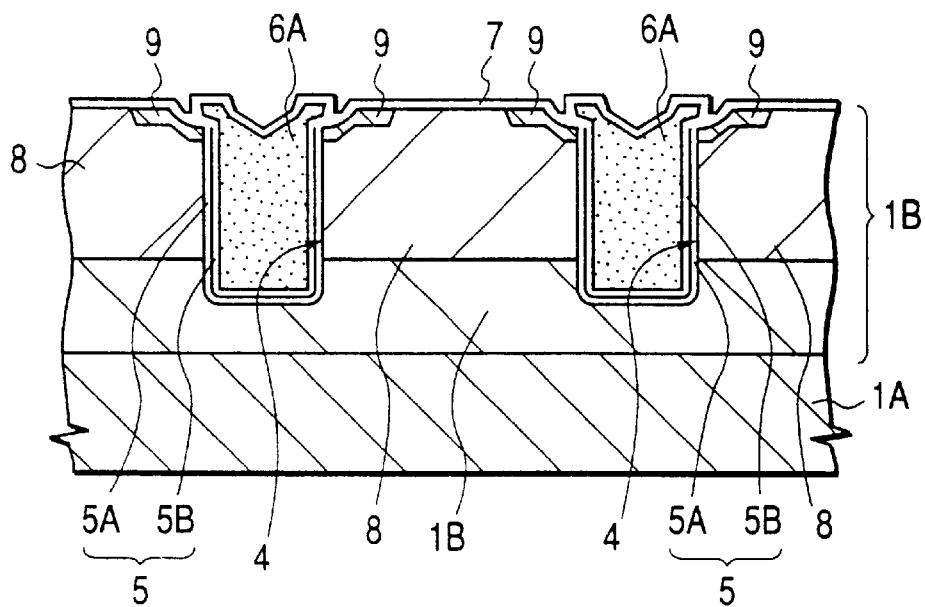
FIG. 23 is a cross-sectional view for illustrating the method of fabricating the power transistor.

Then, after a p-type impurity (for example, boron) has been introduced into the entire major surface of the n$^-$-type semiconductor layer 1B by ion implantation, stretched diffusion process is performed to form the p-type semiconductor region 8 which serves as the channel forming region, as shown in FIG. 23. The stretched diffusion process is performed for about one hour in an $N_2$ gas atmosphere having a temperature of approximately 1,100° C.

Figure 24:
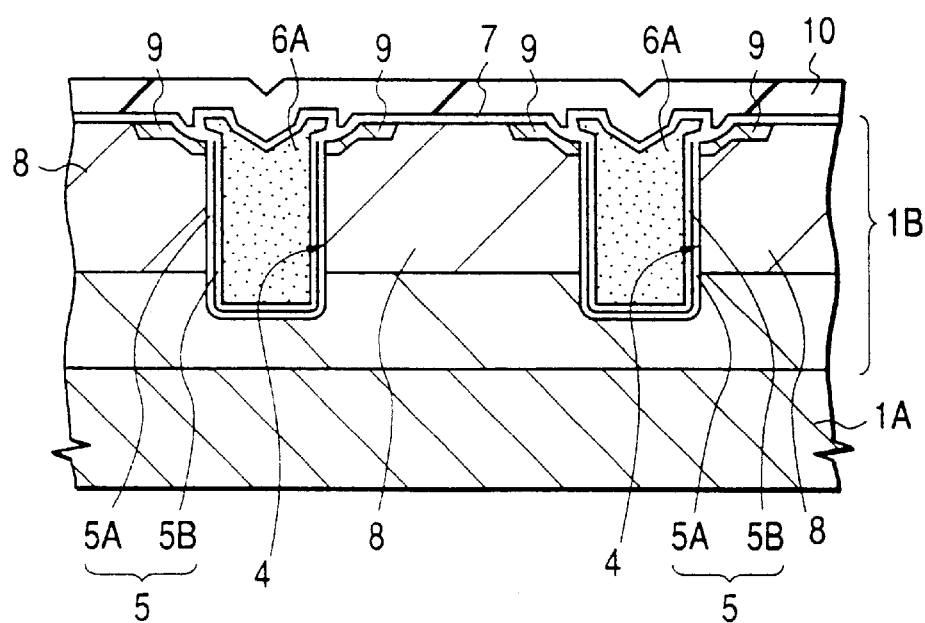
FIG. 24 is a cross-sectional view for illustrating the method of fabricating the power transistor.

Then, after an n-type impurity (for example, arsenic) has been selectively introduced into the major surface of the p-type semiconductor region 8 which is the major surface of the n$^-$-type semiconductor layer 1B, by ion implantation, annealing is performed at a temperature of 950° C. for about 20 minutes to form the n$^+$-type semiconductor region 9 which serves as a source region, as shown in FIG. 24. The introduction of the n-type impurity is performed under the condition that the amount of the n-type impurity to be finally introduced is set to approximately $5 \times 10^{15}$ atoms/cm$^2$ and the amount of energy required during the incorporation is set to 80 KeV. In this step, a MISFET is formed which has a trench gate structure in which the gate insulating film 5 and the gate electrode 6A are formed in the trench 4 of the n$^-$-type semiconductor layer 1B.

Then, as shown in FIG. 24, the interlayer insulation film 10 having a film thickness of, for example, approximately 500 nm is formed over the entire surface of the n$^-$-type semiconductor layer 1B. The interlayer insulation film 10 is formed of, for example, a BPSG (Boro Phospho Silicate Glass) film.

Figure 25:
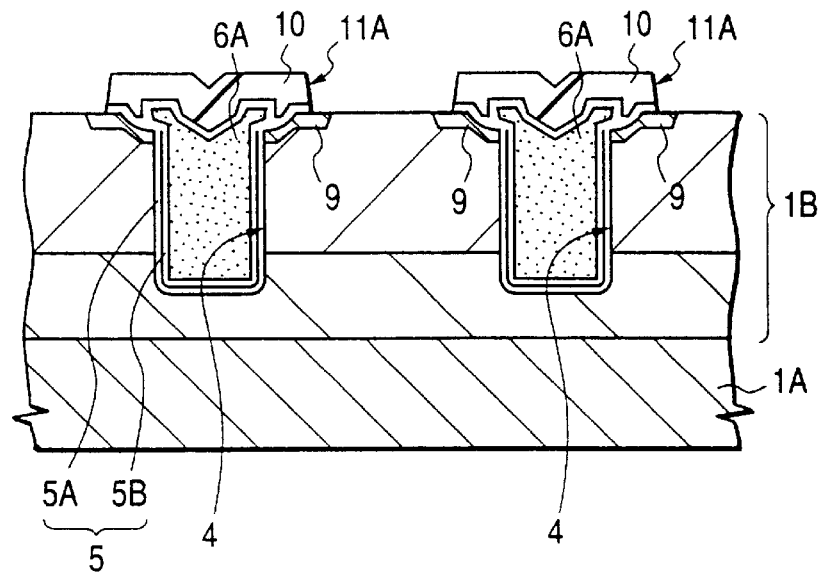
FIG. 25 is a cross-sectional view for illustrating the method of fabricating the power transistor.

Then, anisotropic dry etching using $CHF_3$ gas is performed to form the contact hole 11A and the contact hole 11B (shown in FIG. 3) in the interlayer insulation film 10, as shown in FIG. 25.

Then, after a conductive film comprising, for example, an aluminum film or an aluminum alloy film has been formed over the entire major surface of the n$^-$-type semiconductor layer 1B, inclusive of the insides of the contact holes 11A and 11B, the conductive film is patterned to form the source interconnection 12A to be electrically connected to the p-type semiconductor region 8 and the n⁺-type semiconductor region 9, and to form the gate interconnection 12B (shown in FIG. 3) to be electrically connected to the gate lead-out electrode 6B.

Then, the final passivation film 13 is formed over the entire major surface of the n⁻-type semiconductor layer 1B, inclusive of the top surface of the source interconnection 12A and the top surface of the gate lead-out electrode 6B. The final passivation film 13 is, for example, a silicon oxide film deposited by a plasma chemical vapor deposition method which uses a tetraethoxysilane (TEOS) gas as a principal component of a source gas.

Figure 26:
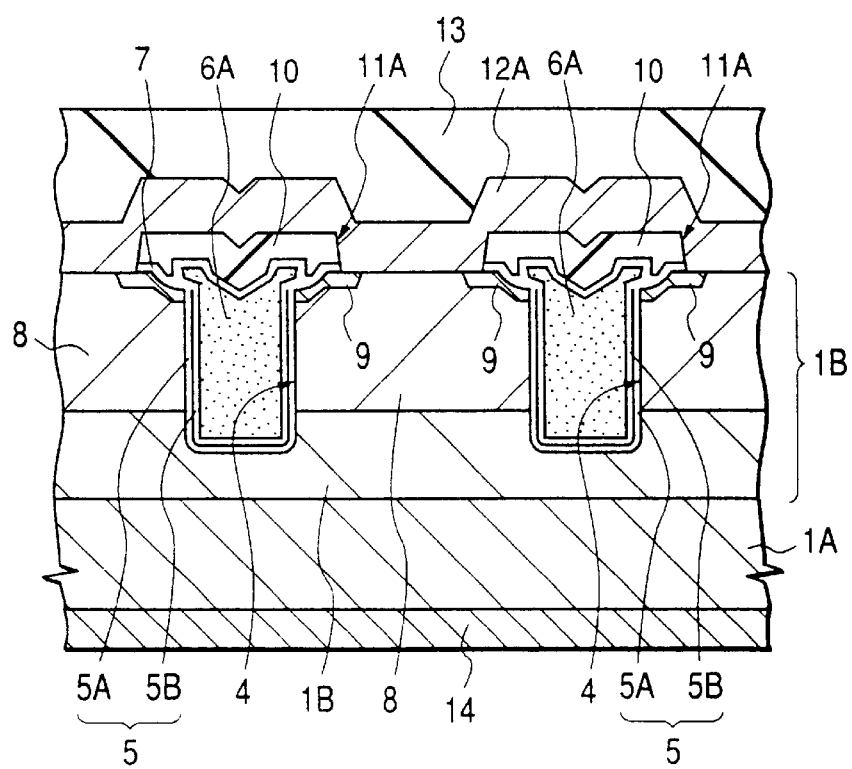
FIG. 26 is a cross-sectional view for illustrating the method of fabricating the power transistor.

Then, a bonding opening in which the surface of a part of the source interconnection 12A is exposed and a bonding opening in which the surface of a part of the gate interconnection 12B is exposed are formed in the final passivation film 13. After that, the back of the n⁺-type semiconductor substrate 1A is ground, and then the drain electrode 14 is formed on the back of the n⁺-type semiconductor substrate 1A as shown in FIG. 26. Thus, the power transistor having a MISFET having a trench gate structure is almost finished.

As is apparent from the above description, similarly to the previously-described first embodiment, the fabrication method of the second embodiment comprises the steps of forming the trench 4 from the major surface of the n⁻-type semiconductor layer 1B which serves as the drain region, in the depth direction of the n⁻-type semiconductor layer 1B, forming the gate insulating film 5 comprising the thermal oxide film 5A and the deposition film 5B over the internal surface of the trench 4, forming the gate electrode 6A in the trench 4, introducing impurities into the n⁻-type semiconductor layer 1B to form the p-type semiconductor region 8 which serves as the channel forming region, and introducing impurities into the p-type semiconductor region 8 to form the n⁺-type semiconductor region 9 which serves as the source region. Accordingly, the second embodiment has effects similar to those of the first embodiment.

Although the invention made by the present inventors has been specifically described with reference to the first and second embodiments, the present invention is not limited to either of the aforesaid embodiments and various modifications can of course be made without departing from the spirit and scope of the present invention.

For example, the present invention can be applied to a power transistor (semiconductor device) having a MISFET of p-channel conductivity type and of trench gate structure.

Otherwise, the present invention can be applied to a power transistor (semiconductor device) having an IGBT (Insulated Gate Bipolar Transistor) of trench gate structure.

The effect which representative aspects of the present invention disclosed herein have will be described in brief below.

It is possible to increase the reliability of a semiconductor device having a transistor element of trench gate structure and provide stable FET characteristics of good reproducibility.

What is claimed is:

1. A metal insulator semiconductor field effect type semiconductor device comprising:
    a semiconductor body having first and second main surfaces which are opposite to each other, said first major surface including an element forming region for forming metal insulator semiconductor field effect type elements and a gate lead-out region for forming a gate lead-out electrode of said elements, said gate lead-out region adjoining said element forming region;
    a plurality of trench portions extended from one side of said semiconductor body adjoining said gate lead-out region to the other side of said semiconductor body located in said element forming region apart from said gate lead-out region in a first direction from said gate lead-out region to said element forming region, so that said element forming region divided into a plurality of transistor element portions sandwiched between adjacent ones of said plural trench portions, each of said trench portions having a sidewall height from a bottom thereof in said semiconductor body to a top surface of said first major surface;
    a first insulation film formed over the sidewall and bottom of each of said trench portions and over the top surface of said first major surface in said gate lead-out region;
    an electrode conductive film disposed over said first insulation film so as to fill each of said trench portions with said electrode conductive film, and disposed over the top surface of said major surface in said gate leadout region but leaving said plural transistor element portions uncovered, said electrode conductive film extended, at said one sides of the plural trench portions, from each of said trench portions onto the top surface of said first major surface in said gate lead-out region;
    said electrode conductive film having a plurality of first portions which are respectively disposed in said trench portions, each of said first portions having a top surface in each said trench portion at a height from said bottom of each said trench portion, said height of each said first portion is lower than that of said sidewall of each said trench portion, said plurality of first portions of the electrode conductive film serving as gate electrodes, respectively;
    said electrode conductive film having a second portion which is extended over the top surface of said first major surface in said gate lead-out region and is formed integrally with said first portions, said second portion of the electrode conductive film serving as a gate lead-out electrode electrically and commonly connected to said first portions of the electrode conductive film;
    a second insulation film formed over said electrode conductive film and over said plural transistor element portions, said second insulation film having a first contact hole, which exposes said second portion of the electrode conductive film disposed over said gate lead-out region, and having second contact holes, which expose said plural transistor element portions respectively;
    a gate interconnection conductive film overlying said gate lead-out region and contacted with said second portion of the electrode conductive film through said first contact hole of the second insulating film; and
    a source interconnection conductive film overlying said element forming region, and contacted with said transistor element portions through said second contact holes of the second insulating film so as to electrically connect said transistor element portions in common, said source interconnection conductive film having portions extended across said trench portions.

2. A semiconductor device according to claim 1, wherein said other sides of the plural trench portions are commonly connected with a second trench portion which is extended in a second direction perpendicular to said first direction, and wherein said second trench portion is filled with said electrode conductive film and is electrically connected to said other sides of the plural trench portions in common.

3. A semiconductor device according to claim 2, wherein said one sides of the plural trench portions are commonly connected with a third trench portion which is extended in the second direction perpendicular to said first direction, and wherein said third trench portion is filled with said electrode conductive film and is electrically connected to said one sides of the plural trench portions in common.

4. A semiconductor device according to claim 3, wherein said plural trench portions and said second and third trench portions define each of said plural transistor element portions as an octagonal shape in plan view.

5. A semiconductor device according to claim 2, further comprising:
    a drain electrode conductive film formed on said second major surface of said semiconductor body.

6. A semiconductor device according to claim 5, further comprising:
    a third insulating film overlying said gate and source interconnection conductive films, and having bonding openings for exposing portions of said gate and source interconnection conductive films.

7. A semiconductor device according to claim 6, further comprising:
    a drain electrode conductive film formed on said second major surface of said semiconductor body.

8. A semiconductor device according to claim 7, wherein each of said transistor element portions comprises:
    a channel forming region of one conductivity type extending into the corresponding transistor element portion from said first major surface to such a depth that said channel forming region forms a PN junction with a drain region of the opposite conductivity type which extends from said second major surface of the semiconductor body thereto; and
    a source region of said opposite conductivity type formed in said channel forming region and extending to said first major surface.

9. A semiconductor device according to claim 8, wherein said gate conductive film comprises a polycrystalline silicon film, and wherein each of said source and gate interconnection conductive films comprises an aluminum film.

* * * * *